United States Patent [19]

Iwata et al.

[11] Patent Number: 5,724,818
[45] Date of Patent: Mar. 10, 1998

[54] THERMOELECTRIC COOLING MODULE AND METHOD FOR MANUFACTURING THE SAME

[75] Inventors: Yuji Iwata; Noriyasu Sasa, both of Hokkaido, Japan

[73] Assignee: Aisin Seiki Kabushiki Kaisha, Kariya, Japan

[21] Appl. No.: 686,490

[22] Filed: Jul. 25, 1996

[30] Foreign Application Priority Data

Jul. 27, 1995 [JP] Japan .................. 7-191867
May 30, 1996 [JP] Japan .................. 8-136886

[51] Int. Cl.$^6$ ........................................ H01L 35/34
[52] U.S. Cl. ........................... 62/3.7; 62/259.2
[58] Field of Search ................. 62/3.2, 3.1, 3.7, 62/3.3, 259.2

[56] References Cited

U.S. PATENT DOCUMENTS

| | | | |
|---|---|---|---|
| 3,054,842 | 9/1962 | Bowers et al. | 62/3.7 |
| 3,167,926 | 2/1965 | Wepfer et al. | 62/3.2 |
| 3,370,434 | 2/1968 | Mole | 62/3.2 |
| 3,834,171 | 9/1974 | Johansson | 62/3.2 |
| 5,038,569 | 8/1991 | Shirota et al. | 62/3.2 |

FOREIGN PATENT DOCUMENTS

| | | |
|---|---|---|
| 1-205451 | 8/1979 | Japan . |
| 1-205451 | 8/1989 | Japan . |
| 2-103969 | 4/1990 | Japan . |
| 3-263382 | 11/1991 | Japan . |
| 911433 | 11/1962 | United Kingdom ...... 62/3.2 |

*Primary Examiner*—William Doerrler
*Attorney, Agent, or Firm*—Oblon, Spivak, McClelland, Maier & Neustadt, P.C.

[57] ABSTRACT

A thermoelectric cooling module, in which an electronic device is cooled due to the Peltier effect of P-type and N-type thermoelectric semiconductor elements, comprising a heat radiating section which comprises a heat radiating electrode having a fin-shaped portion for heat radiation integrally formed, a heat absorbing section comprising heat absorbing electrode contacted with the electronic device, and a thermoelectric conversion section comprising the P-type and N-type thermoelectric semiconductor elements interposed between the heat radiating electrode and the heat absorbing electrode.

18 Claims, 5 Drawing Sheets

F I G. 1
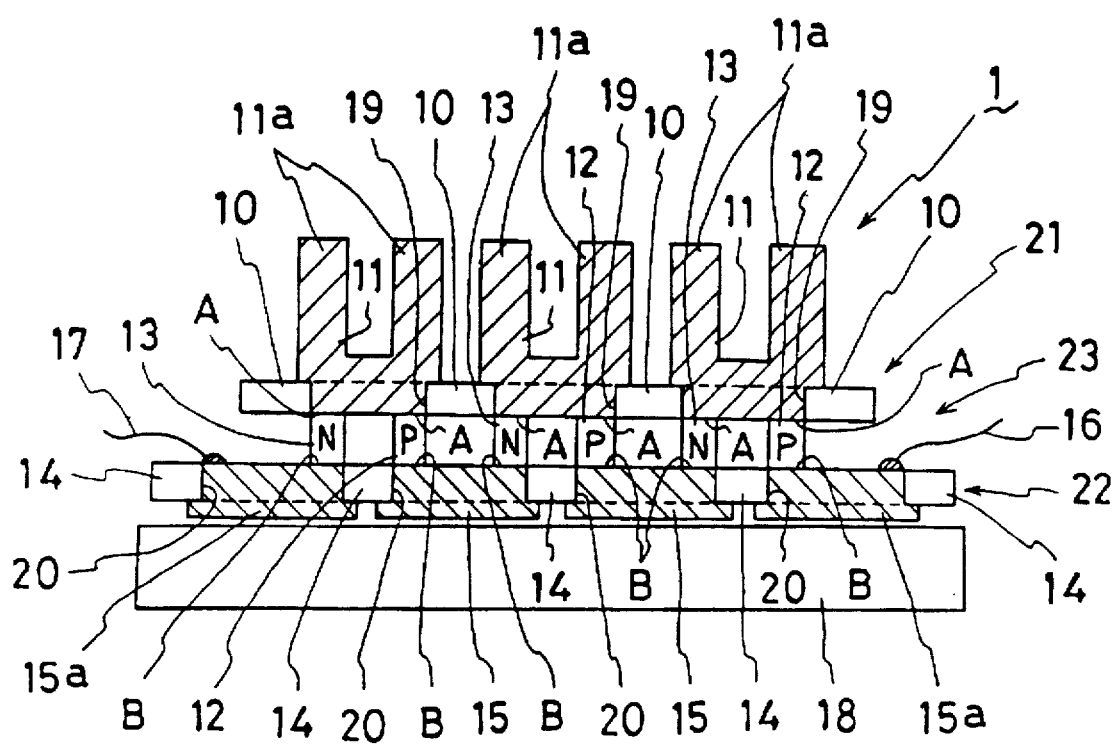

(a)

(b)

(c)

(d)

(a)

(b)

THERMOELECTRIC COOLING MODULE AND METHOD FOR MANUFACTURING THE SAME

BACKGROUND OF THE INVENTION

1. Field of the Invention

The present invention relates to a thermoelectric cooling module utilizing the Peltier effect to cool an object, and more particularly, to a thermoelectric cooling module aiming at cooling or temperature control of electronic devices such as an MPU (Micro Processor Unit).

2. Description of the Prior Art

Generally, conventional thermoelectric cooling module used for cooling electronic devices have a structure as shown in FIG. 5. That is, alternately disposed N-type semiconductor elements 51 and P-type semiconductor elements 52 are sandwiched between heat radiating electrodes 54, which are formed under a radiation-side insulating substrate 53 in the drawing, and heat absorbing electrodes 56, which are formed above an absorption-side insulating substrate 55 in the drawing. The N-type thermoelectric semiconductor elements 51 and the P-type thermoelectric semiconductor elements 52 are electrically connected in series, and a current is passed therethrough so as to obtain the Peltier effect, in which heat is radiated at the interfaces between the heat radiating electrodes 54 and the N-type semiconductor elements 51 or at the interfaces between the heat radiating electrodes 54 and the P-type semiconductor elements 52, while heat is absorbed at the interfaces between the heat absorbing electrodes 56 and the N-type semiconductor elements 51 or at the interfaces between the heat absorbing electrodes 56 and the P-type semiconductor elements 52. Above the radiation-side insulating substrate 53 in the drawing is disposed a heat radiating fin section 57. Heat generated at the interfaces between the heat radiating electrodes 54 and the N-type semiconductor elements 51 or at the interfaces between the heat radiating electrodes 54 and the P-type semiconductor elements 52 is transmitted to the heat radiating fin section 57 via the radiation-side insulating substrate 53, and the transmitted heat is radiated from the heat radiating fin section 57 to the outside. An electronic device 58 from which heat is absorbed is situated under the absorption-side insulating substrate 55, and heat generated by the electronic device 58 is absorbed through the absorption-side insulating substrate 55. In this manner, the thermoelectric cooling module performs its function of taking heat away from the electronic device 58, thereby cooling the electronic device.

In the thermoelectric cooling module having the above-described structure, the heat radiating fin section is mounted on the radiation-side insulating substrate. This structure requires complicated assembly work and makes it difficult to decrease manufacturing costs. Also, in the thermoelectric cooling module, heat generated at the interfaces between the heat radiating electrodes and the N-type semiconductor elements or at the interfaces between the heat radiating electrodes and the P-type semiconductor elements is transmitted to the heat radiating fin section via the radiation-side insulating substrate. However, since insulating materials generally have poor heat conductivity, there is a possibility that heat is not sufficiently transferred to the heat radiating fins. Further, although the radiation-side insulating substrate and the radiation fin base portion (denoted by symbol 59 in FIG. 5), through which the heat radiating fine section is fixed to the radiation-side insulating substrate do not contribute much to heat radiation, they occupy a considerable portion of the thermoelectric cooling module in terms of space. The presence of this portion makes it difficult to reduce the size of the thermoelectric cooling module. Furthermore, in the structure of the thermoelectric cooling module, heat generated by the electronic device from which heat is to be absorbed is conducted to the heat absorbing electrodes via the absorption-side insulating substrate. However, since insulating materials generally have poor heat conductivity as has been described, there is a possibility that heat generated from the electronic device cannot be taken away sufficiently, resulting in a decrease in the efficiency of thermoelectric cooling. To overcome these problems, thermoelectric cooling apparatuses have been devised in which electrodes function as a heat exchanger, as disclosed in Japanese Patent Application Laid-Open (kokai) Nos. 1-205451, 2-103969, and 3-263382. However, these apparatuses have complex structures and therefore require complicated manufacturing processes. In addition, since these apparatuses are designed to cool fluid, they have a problem that they cannot cool electronic devices directly.

SUMMARY OF THE INVENTION

It is an object of the present invention to provide a thermoelectric cooling module of high efficiency in thermoelectric cooling.

It is another object of the present invention to improve heat radiating efficiency in a thermoelectric cooling module.

A further object of the present invention is to provide a thermoelectric cooling module for cooling directly an electronic device.

A still further object of the present invention is to provide a thermoelectric cooling module of simplified structure and compact size.

A yet further object of the present invention is to improve productivity in a method for manufacturing a thermoelectric cooling module.

A yet further object of the present invention is to decrease manufacturing costs in a method for manufacturing a thermoelectric cooling module.

Another object of the present invention is to provide a thermoelectric cooling module in which an electronic device is cooled due to the Peltier effect of P-type and N-type thermoelectric semiconductor elements, comprising: a heat radiating section comprising a heat radiating electrode having a fin-shaped portion for heat radiation integrally formed, a heat absorbing section comprising heat absorbing electrode contacted with the electronic device, and a thermoelectric conversion section comprising the P-type and N-type thermoelectric semiconductor elements interposed between the heat radiating electrode and the heat absorbing electrode.

A further object of the present invention is to provide a thermoelectric cooling module wherein the heat absorbing electrode has an electrode portion integrally formed.

A still further object of the present invention is to provide a thermoelectric cooling module wherein the heat radiating section further comprises a radiation-side insulating substrate having a plurality of through holes in which plurality of electrode portions of the heat radiating electrode are interposed.

A yet further object of the present invention is to provide a thermoelectric cooling module wherein the heat absorbing section further comprises an absorption side insulating substrate having a plurality of through holes in which the plurality of electrode portions of the heat absorbing electrodes are integrally interposed.

Another object of the present invention is to provide a thermoelectric cooling module wherein the heat absorbing electrode, P-type thermoelectric semiconductor element, heat radiating electrode and N-type thermoelectric semiconductor element are connected in series.

A further object of the present invention is to provide a thermoelectric cooling module wherein plurality of groups of the electrode portion of the heat absorbing electrode, P-type thermoelectric semiconductor element, the electrode portion of the heat radiating electrode and N-type thermoelectric semiconductor element are connected respectively in series.

A still further object of the present invention is to provide a thermoelectric cooling module wherein the radiation-side insulating substrate and the absorption-side insulating substrate have plurality of rectangular through holes like a grid.

A yet further object of the present invention is to provide a thermoelectric cooling module wherein the electrode portions of the heat radiating electrode and the heat absorbing electrode are rectangular projections.

A yet further object of the present invention is to provide a thermoelectric cooling module wherein the fin-shaped portion comprises a rectangular base and four square column integrally formed at four corner portions of the rectangular base.

Another object of the present invention is to provide a thermoelectric cooling module wherein the heat absorbing electrode has plurality of rectangular contacted portions for contacting with the electronic device integrally formed with the electrode portions, the contacted portion having larger rectangular plate portion than that of the electrode portion.

To achieve the above-described technical object, the present invention provides technical means as follows. That is, there is provided a thermoelectric cooling module in which a serial connection in which a heat absorbing electrode, a P-type thermoelectric semiconductor element, a heat radiating electrode, and an N-type thermoelectric semiconductor element are electrically connected in this order is repeated a plurality of times, and when a current is supplied, the heat absorbing electrode absorbs heat while the heat radiating electrode radiates the absorbed heat due to the Peltier effect, thereby cooling an electronic device.

The thermoelectric cooling module is characterized by comprising:

a heat radiating section having a radiation-side insulating substrate and the heat radiating electrodes which are respectively inserted into and fixed to a plurality of through holes formed in the radiation-side insulating substrate and which have at one of its ends a fin-shaped portion for heat radiation;

a heat absorbing section having an absorption-side insulating substrate, and the heat absorbing electrodes which are respectively inserted into and fixed to a plurality of through holes formed in the absorption-side insulating substrate and one of whose end surfaces is in direct contact with an object to be cooled; and a thermoelectric conversion section having a plurality of the P-type semiconductor elements and a plurality of the N-type semiconductor elements which are disposed between the heat radiating section and the heat absorbing section in an alternating manner, wherein when a current is supplied, heat is radiated at the interfaces between the P-type semiconductor elements and the heat radiating electrodes and at the interfaces between the N-type semiconductor elements and the heat radiating electrodes, and heat is absorbed at the interfaces between the P-type semiconductor elements and the heat absorbing electrodes and at the interfaces between the N-type semiconductor elements and the heat absorbing electrodes.

According to the present invention having the above-described construction, each heat radiating electrode has a fin-shaped portion for heat radiation at one of its ends. Since the heat radiating electrode itself radiates heat to the outside, it is unnecessary to additionally provide a radiator. This makes it possible to greatly decrease manufacturing costs. Also, the heat generated at the interfaces between the heat radiating electrodes and the P-type semiconductor elements or at the interfaces between the heat radiating electrodes and the N-type semiconductor elements is radiated directly from the fin-shaped portion of each heat radiating electrode without intervention of the radiation-side insulating substrate. This improves the heat radiating efficiency and therefore makes it possible to improve the efficiency of the thermoelectric cooling module. Since the heat radiating electrodes are inserted into and fixed to the plurality of through holes formed in the radiation-side insulating substrate, it is possible to eliminate useless spaces which do not contribute to heat radiation, so that the size of the thermoelectric cooling module can be decreased. Moreover, since the heat absorbing electrodes are in direct contact with an electronic device from which heat is to be absorbed, the heat generated by the electronic device is conducted to the heat absorbing electrodes directly without intervention of the absorption-side insulating substrate. This improves the heat absorbing efficiency and therefore makes it possible to improve the efficiency of the thermoelectric cooling module. Furthermore, the radiation-side insulating substrate and the heat radiating electrodes are integrated to form the heat radiating section, while the absorption-side insulating substrate and the heat absorbing electrodes are integrated to form the heat absorbing section. Accordingly, the manufacturing steps for manufacturing these sections can be simplified, thereby facilitating production.

When the present invention having the above-described construction is employed, the object to be cooled is preferably an electronic device which is required to have temperature stability. In many cases, the performance of an electronic device is greatly affected-by the temperature. In the present invention, the heat absorbing electrodes are in direct contact with the electronic device so as to accelerate cooling, thereby coping with heat generation of the electronic device. This maintains the electronic device at a constant temperature so that the performance of the electronic device can be maintained.

Preferably, the electronic device is a CPU, MPU, transistor, IC, semiconductor laser, light emitting diode, CCD, or oscillating circuit. Among electronic devices, the performance of each of these electronic devices has a large temperature dependency. Accordingly, the heat absorbing electrodes are brought into direct contact with the electronic device so as to cool it directly, thereby coping with heat generation of the electronic device. This maintains the electronic device at a constant temperature so that the performance of the electronic device can be maintained.

To achieve the above-described technical object, the present invention provides technical means. That is, there is provided a method for manufacturing a thermoelectric cooling module in which a serial connection in which a heat absorbing electrode, a P-type thermoelectric semiconductor element, a heat radiating electrode, and an N-type thermoelectric semiconductor element are electrically connected in this order is repeated a plurality of times, and when a current is supplied, the heat absorbing electrode absorbs heat while the heat radiating electrode radiates the absorbed heat due to the Peltier effect, thereby cooling an electronic device.

The method is characterized by comprising:

a heat radiating section manufacturing step of inserting a heat radiating electrode having a fin-shaped portion into each of a plurality of through holes formed in a radiation-side insulating substrate and fixing the heat radiating electrode to the radiation-side insulating substrate, thereby manufacturing a heat radiating section;

a heat absorbing section manufacturing step of inserting a heat absorbing electrode into each of a plurality of through holes formed in an absorption-side insulating substrate and fixing the heat absorbing electrode to the absorption-side insulating substrate, thereby manufacturing a heat absorbing section; and a joining step of joining one end surface of each P-type semiconductor and one end surface of each N-type semiconductor to the heat radiating section, while joining the other end surface of the P-type semiconductor and the other end surface of the N-type semiconductor to the heat absorbing section.

According to the above-described steps, the method for manufacturing a thermoelectric cooling module comprises a heat radiating section manufacturing step of integrating a radiation-side insulating substrate and heat radiating electrodes, a heat absorbing section manufacturing step of integrating an absorption-side insulating substrate and heat absorbing electrodes, and a joining step of joining thermoelectric semiconductor elements to the heat radiating section and the heat absorbing section. Accordingly, the manufacturing process for manufacturing the thermoelectric cooling module can be greatly simplified, so that manufacture of the thermoelectric cooling module can be performed with excellent productivity.

The present invention provides the following effects. Since each heat radiating electrode functions as a radiator, it becomes unnecessary to additionally provide a radiator, thereby greatly decreasing manufacturing costs. Also, since the heat radiating electrodes and the radiation-side insulating substrate are integrally formed and the heat absorbing electrodes and the absorption-side insulating substrate are formed integrally, the productivity is excellent. In addition, useless spaces can be eliminated, and the size of the thermoelectric cooling module can be decreased. Further, since each heat radiating electrode functions as a radiator, heat generated at the interfaces between the heat radiating electrodes and the P-type semiconductor elements or the N-type semiconductor elements is radiated directly from the heat radiating electrodes without intervention of the radiation-side insulating substrate. This improves the heat radiating efficiency and therefore makes it possible to improve the efficiency of the thermoelectric cooling module. Moreover, since the heat absorbing electrodes are in direct contact with an electronic device from which heat is to be absorbed, the heat generated by the electronic device is conducted to the heat absorbing electrodes directly without intervention of the absorption-side insulating substrate. This improves the heat absorbing efficiency and therefore makes it possible to improve the efficiency of the thermoelectric cooling module.

The present invention has the following effect. Since the heat absorbing electrodes are in direct contact with the electronic device so as to accelerate cooling, thereby coping with heat generation of the electronic device which has a large temperature dependency. This maintains the electronic device at a constant temperature so that the performance of the electronic device can be maintained.

The present invention has the following effect. Among electric devices, a CPU, MPU, transistor, IC, semiconductor laser, light emitting diode, CCD, or oscillating circuit, the performance of which has a large temperature dependency is selected as an object to be cooled. This object is brought into direct contact with the heat absorbing electrodes so as to improve the cooling performance, thereby coping with heat generation of the electronic device. Accordingly, the performance of the electronic device can be maintained.

The present invention has the following effect. Since the method for manufacturing a thermoelectric cooling module comprises a heat radiating section manufacturing step of integrating a radiation-side insulating substrate and heat radiating electrodes, a heat absorbing section manufacturing step of integrating an absorption-side insulating substrate and heat absorbing electrodes, and a joining step of joining P-type and N-type semiconductor elements to the heat radiating section and the heat absorbing section, the manufacturing process for manufacturing the thermoelectric cooling module can be greatly simplified, so that manufacture of the thermoelectric Cooling module can be performed with excellent productivity.

BRIEF DESCRIPTION OF THE DRAWINGS

FIG. 1 is a partially sectioned view of a thermoelectric cooling module according to an embodiment of the present invention;

DETAILED DESCRIPTION OF PREFERRED EMBODIMENT

Figure 2:
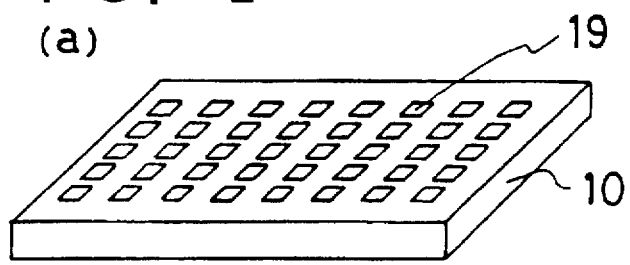
FIG. 2 an explanatory diagram showing the heat radiating section manufacturing step of a method for manufacturing a thermoelectric cooling module according to the embodiment of the invention.
Figure 2:
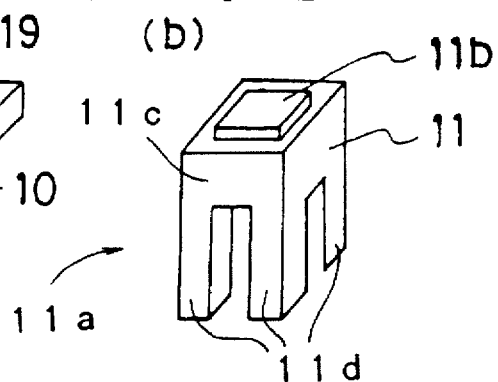
Figure 2:
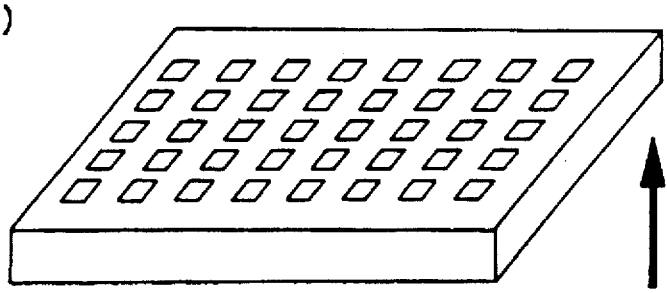
Figure 2:
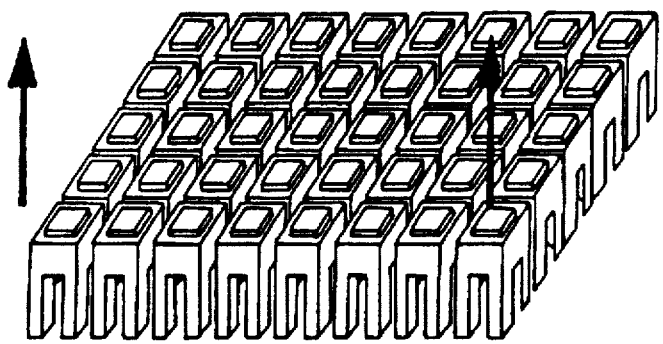

An embodiment of the present invention will now be described with reference to the drawings.

FIG. 1 is a partially sectioned view of a thermoelectric cooling module 1 according to the present embodiment. Numeral 10 denotes a radiation-side insulating substrate made of ceramic. Numeral 11 denotes heat radiating electrodes made of copper. The heat radiating electrodes 11 have rectangular electrode portions 11b which are partially inserted into a plurality of rectangular through holes 19 formed in the radiation-side insulating substrate 10 and are fixed thereto using adhesive or the like. Each of the heat radiating electrodes 11 has at one of its ends a fin-shaped portion 11a for heat radiation. The radiation-side insulating substrate 10 and the heat radiating electrodes 11 constitute a heat radiating section 21.

The fin-shaped portion 11a has a rectangular base 11c and four square columns 11d integrally formed at four corner portions of said rectangular base 11c as shown in FIGS. 2(b) and 2(d).

Numeral 14 denotes an absorption-side insulating substrate made of ceramic. Numeral 15 denotes heat absorbing electrodes made of copper. The heat absorbing electrodes 15 have rectangular electrode portions 15b which are partially inserted into a plurality of rectangular through holes 20 formed in the absorption-side insulating substrate 14 and are fixed thereto using adhesive or the like. The absorption-side insulating substrate 14 and the heat absorbing electrodes 15 constitute a heat absorbing section 22.

Between the insulating substrates 10 and 14 are disposed P-type thermoelectric semiconductor elements 12 and N-type thermoelectric semiconductor elements 13. Each of the P-type thermoelectric semiconductor elements 12 and the N-type thermoelectric semiconductor elements 13 is in contact with the corresponding heat radiating electrode 11 via one of its end surfaces, and is in contact with the corresponding heat absorbing electrode 15 via its other end surface. Among the plurality of heat absorbing electrodes 15, each of rectangular contacted portions 15a of the heat absorbing electrodes 15 located at the ends is in contact with one of the P-type thermoelectric semiconductor elements 12 or one of the N-type thermoelectric semiconductor elements 13. Each of the remaining heat absorbing electrodes 15 and the heat radiating electrodes 11 is in contact with one of the P-type thermoelectric semiconductor elements 12 and one of the N-type thermoelectric semiconductor elements 13. A P-type thermoelectric semiconductor element 12 and an N-type thermoelectric semiconductor element 13 in contact at one end surface thereof with a heat radiating electrode 11 are disposed such that each of the elements is in contact with a different heat absorbing electrode 15 through the other end surface thereof. Similarly, a P-type thermoelectric semiconductor element 12 and an N-type thermoelectric semiconductor element 13 in contact at one surface thereof with a heat absorbing electrode 15 are disposed such that each of the elements is in contact with a different heat radiating electrode 11 through the other end surface thereof. By disposing the semiconductor elements in this manner, the heat absorbing electrodes 15, the P-type thermoelectric semiconductor elements 12, the heat radiating electrodes 11, and the N-type thermoelectric semiconductor elements 13 are repeatedly connected in this order to form an electrical serial connection. Numerals 16 and 17 denote lead wires which are soldered to the respective heat absorbing electrodes 15a located at the ends so as to supply current to the thermoelectric cooling module 1. The P-type thermoelectric semiconductor elements 12, the N-type thermoelectric semiconductor elements 13, and the lead wires 16 and 17 constitute a thermoelectric conversion section 23.

Numeral 18 denotes an electronic device from which heat is to be absorbed. Examples of the electronic device mainly include a CPU (Central Processing Unit), an MPU (Micro Processor Unit), a transistor, an IC (Integrated circuit), a semiconductor laser, a light emitting diode, and a CCD (Charge-coupled device).

Figure 5:
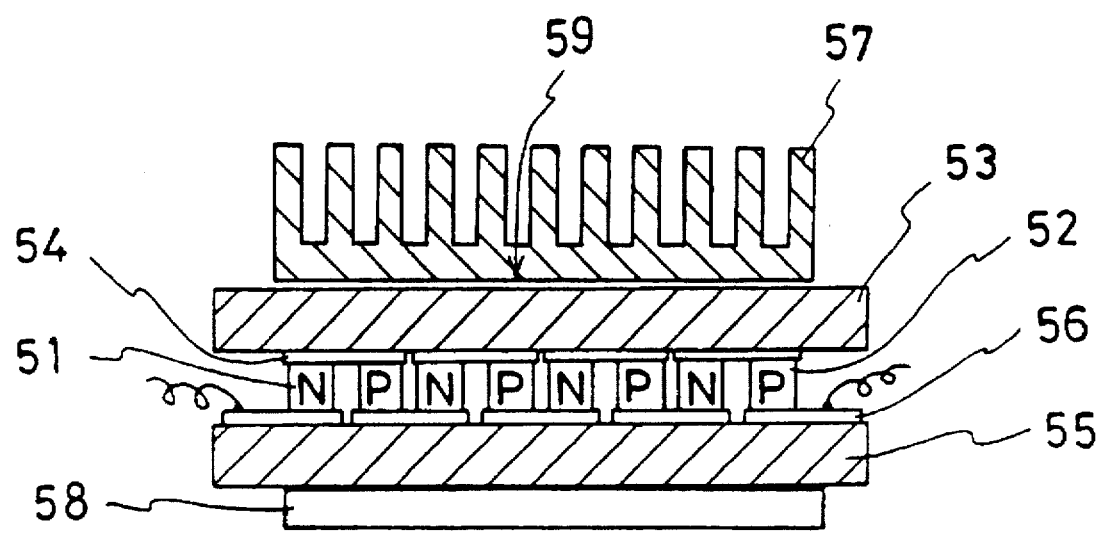
FIG. 5 is a partially sectioned view of a conventional thermoelectric cooling module.

In the thermoelectric conversion module having the above-described structure, when a DC voltage is applied between the lead wires 16 and 17, a current flows through the heat absorbing electrodes 15, the P-type semiconductor elements 12, the heat radiating electrodes 11, and the N-type semiconductor elements 13 in this order. At this time, due to the Peltier effect, heat is generated at the interfaces A between the P-type and N-type thermoelectric semiconductor elements 12 and 13 and the heat radiating electrodes 11 made of copper, while heat is absorbed at the interfaces B between the P-type and N-type thermoelectric semiconductor elements 12 and 13 and the heat absorbing electrodes 15 made of copper. The heat generated at the interfaces A is conducted to the heat radiating electrodes 11 made of copper and is radiated into the air through the fin-shaped portion 11a. Heat generated from the electronic device 18 from which heat is to be absorbed is conducted directly to the heat absorbing electrodes 15 and is absorbed thereby. Next, the conventional cooling module shown in FIG. 5 will be compared with the present embodiment. In the conventional cooling module, since heat generated at the heat radiating electrodes is conducted to the heat radiation fin section via the radiation-side insulating substrate and is radiated to the outside, the radiation-side insulating substrate having a low heat conductivity serves as a heat resistance, which deteriorates the heat radiating efficiency. In contrast, in the present embodiment, since heat generated at the heat radiating electrodes is conducted directly to the fin-shaped portion provided at one end of each heat radiating electrode, a material serving as a heat resistance does not exist in the path of heat. Accordingly, the heat radiating efficiency is increased considerably. In the conventional cooling module, since heat generated from the electronic device is absorbed by the heat absorbing electrodes via the absorption-side insulating substrate, the absorption-side insulating substrate having a low heat conductivity serves as a heat resistance, which deteriorates the heat absorbing efficiency. In contrast, in the present embodiment, since the electronic device is in direct contact with the heat absorbing electrodes, a material serving as a heat resistance does not exist in the path of heat generated by the electronic device. Accordingly, the heat absorbing efficiency is increased considerably.

Although the heat radiating electrodes 11 and the heat absorbing electrodes 15 are made of copper in the present embodiment, electrically conductive materials other than copper may be used, provided that they have good heat conductivity. Moreover, although the radiation-side substrate 10 and the absorption-side substrate 14 are made of a ceramic material, insulating materials other than ceramic may be used insofar as they have good heat conductivity.

Next, a description will be given of an example of a manufacturing method according to the present invention.

FIGS. 2 (a)–(d) show the step of manufacturing a heat radiating section. As shown FIG. 2 (a), a plurality of through holes 19 are formed in a radiation-side insulating substrate 10 made of an insulating material such as a ceramic material or polyimide resin. The insertion portion 11b of each heat radiating electrode 11 shown in FIG. 2 (b) is inserted into the corresponding through hole 19 formed in the radiation-side insulating substrate 10, as shown in FIG. 2 (c) and is fixed thereto using adhesive or the like, thereby completing the heat radiating section. FIG. 2 (d) shows a partial cross section of the heat radiating section manufactured in the above-described manner. As shown in FIG. 2 (d), each of the heat radiating electrodes 11 has a fin-shaped portion 11a, which is projected from the radiation-side insulating substrate 10 and which functions as a radiator. Further, from the lower surface of the radiation-side insulating substrate 10 are exposed the insertion portions 11b of the heat radiating electrodes. P-type thermoelectric semiconductor elements and N-type thermoelectric semiconductor elements are joined to the exposed metallic surface in a joining step, which will be described below.

Figure 3:
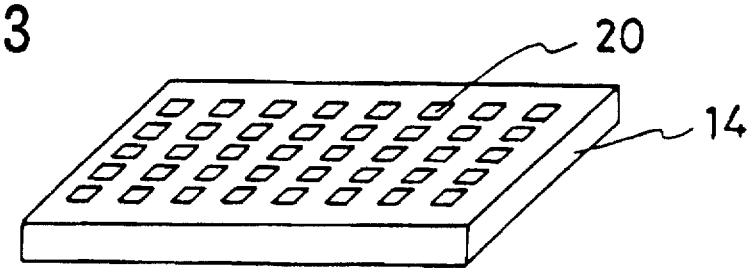
FIG. 3 is an explanatory diagram showing the heat absorbing section manufacturing step of the method for manufacturing a thermoelectric cooling module according to the embodiment of the invention.
Figure 3:
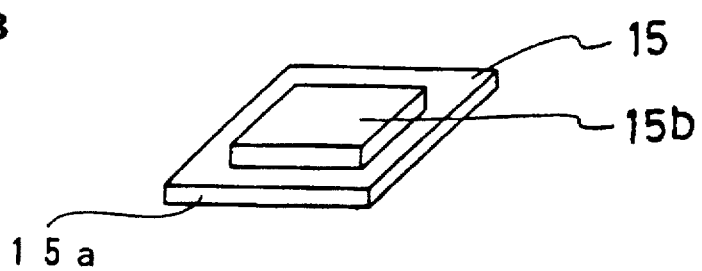
Figure 3:
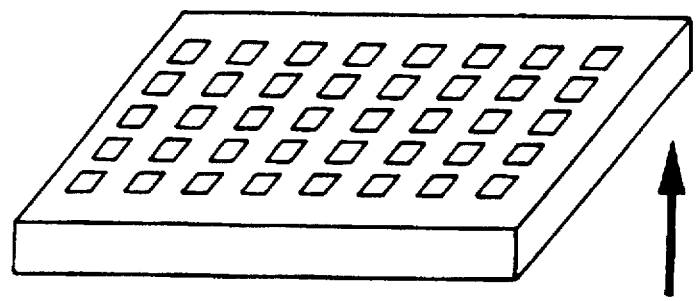
Figure 3:
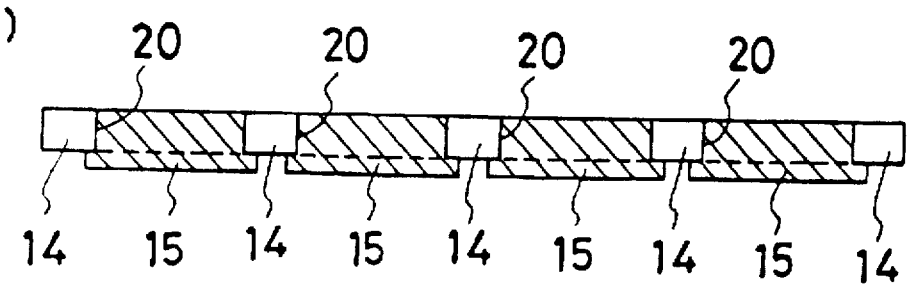

FIGS. 3 (a)–(d) show the step of manufacturing a heat absorbing section. As shown FIG. 3 (a), a plurality of through holes 20 are formed in an absorption-side insulating substrate 14 made of an insulating material such as a ceramic material or polyimide resin. The insertion portion 15b of each heat absorbing electrode 15 shown in FIG. 3 (b) is inserted into the corresponding through hole 20 formed in the absorption-side insulating substrate 14, as shown in FIG. 3 (c), and is fixed thereto using adhesive or the like, thereby completing the heat absorbing section. FIG. 3 (d) shows a partial cross section of the heat absorbing section manufactured in the above-described manner. As shown in FIG. 3 (d), the heat absorbing electrodes 15 are exposed from the upper and lower surfaces of the absorption-side insulating substrate 14. In the below described joining step, the P-type thermoelectric semiconductor elements and the N-type thermoelectric semiconductor elements are joined to the metallic surfaces, which are exposed from the upper surface of the absorption-side insulating substrate 14. An electronic device from which heat is to be absorbed is placed in direct contact with the metallic surface exposed from the lower surface of the absorption-side substrate 14.

Figure 4:
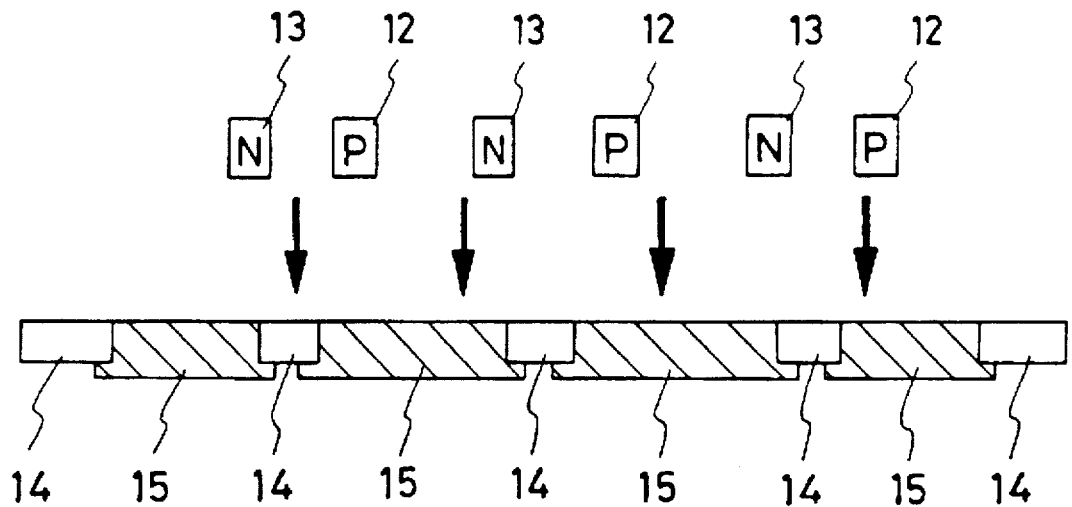
FIG. 4 an explanatory diagram showing the joining step of the method for manufacturing a thermoelectric cooling module according to the embodiment of the invention.
Figure 4:
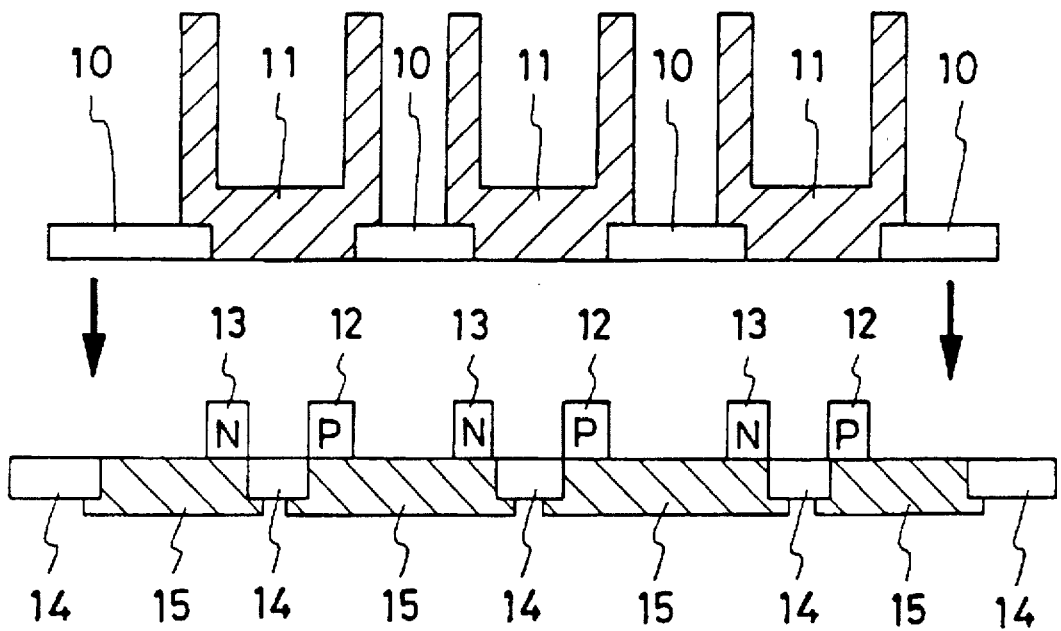

FIG. 4 shows the joining step. As shown in FIG. 4 (a), the N-type semiconductor elements 13 and the P-type semiconductor elements 12 are alternately disposed, using a jig, on the metallic surfaces of the heat absorbing electrodes 15 which are exposed from the upper surface of the absorption-side insulating substrate 14, and are joined to the heat absorbing electrodes 15 through soldering or the like. Subsequently, as shown in FIG. 4 (b), the N-type semiconductor elements 13 and the P-type semiconductor elements 12, each of which has been joined through one of its end surfaces to the absorption-side insulating substrate, are joined to the metallic surfaces of the heat radiating electrodes 11 exposed from the lower surface of the radiation-side insulating substrate 10, through soldering or the like. The thermoelectric cooling module is manufactured in this manner. By employing the above-described manufacturing method, it becomes possible to easily manufacture thermoelectric cooling modules of a high efficiency, thereby facilitating production.

What is claimed is:

1. A thermoelectric cooling module, in which a solid electronic device required to have temperature stability is cooled due to the Peltier effect of P-type and N-type thermoelectric semiconductor elements, comprising:

a heat radiating section comprising a heat radiating electrode having a fin-shaped portion for heat radiation integrally formed;

a heat absorbing section comprising a heat absorbing electrode having a contacting surface contacted directly with said electric device; and a thermoelectric conversion section comprising said P-type and N-type thermoelectric semiconductor elements interposed between and electrically connected by said heat radiating section and said heat absorbing section.

2. A thermoelectric cooling module according to claim 1, wherein said heat absorbing electrode has an electrode portion integrally formed.

3. A thermoelectric cooling module according to claim 2, wherein said heat radiating section further comprises a radiation-side insulating substrate having a plurality of through holes in which plurality of electrode portions of said heat radiating electrode are interposed.

4. A thermoelectric cooling module according to claim 3, wherein said heat absorbing section further comprises an absorption side insulating substrate having a plurality of through holes in which said plurality of electrode portions of said heat absorbing electrodes are respectively interposed.

5. A thermoelectric cooling module according to claim 4, wherein said heat absorbing electrode, P-type thermoelectric semiconductor element, heat radiating electrode and N-type thermoelectric semiconductor element are connected in series.

6. A thermoelectric cooling module according to claim 5, wherein plurality of groups of said electrode portion of said heat absorbing electrode, P-type thermoelectric semiconductor element, said electrode portion of said heat radiating electrode and N-type thermoelectric semiconductor element are connected respectively in series.

7. A thermoelectric cooling module according to claim 6, wherein said radiation-side insulating substrate and said absorption-side insulating substrate have plurality of rectangular through holes like a grid.

8. A thermoelectric cooling module according to claim 7, wherein said electrode portions of said heat radiating electrode and said heat absorbing electrode are rectangular projections.

9. A thermoelectric cooling module according to claim 8, wherein said fin-shaped portion comprises a rectangular base and four square column integrally formed at four corner portions of said rectangular base.

10. A thermoelectric cooling module according to claim 9, wherein said heat absorbing electrode has plurality of rectangular contacted portions for contacting with said electronic device integrally formed with said electrode portions, said contacted portion having larger rectangular plate portion than that of said electrode portion.

11. A thermoelectric cooling module in which a serial connection in which a heat absorbing electrode; a P-type thermoelectric semiconductor element, a heat radiating electrode, and an N-type thermoelectric semiconductor element are electrically connected in this order is repeated a plurality of times, and when a current is supplied, said heat absorbing electrode absorbs heat while said heat radiating electrode radiates the absorbed heat due to the Peltier effect, thereby cooling a solid electrode device required to have temperature stability, said thermoelectric cooling device comprising:

a heat radiating section comprising a heat radiating electrode having a fin-shaped portion for heat radiation integrally formed;

a heat absorbing section having an absorption-side insulating substrate, and said heat absorbing electrodes which are respectively inserted into and fixed to a plurality of through holes formed in said absorption-side insulating substrate and one of whose end surfaces is in direct contact with said electronic device; and a thermoelectric conversion section comprising said P-type and N-type thermoelectric semiconductor elements interposed between said heat radiating section and said heat absorbing section.

12. A thermoelectric cooling module according to claim 11, wherein said electronic device is an electronic device which is required to have temperature stability.

13. A thermoelectric cooling module according to claim 1, wherein:

an area of said contacting surface on said heat absorbing electrode is smaller than that of an outer wall on said fin-shaped portion.

14. A thermoelectric cooling module according to claim 1, wherein:

said heat absorbing electrode comprises a plate member, in order to reduce a distance between said thermoelectric semiconductor elements and said solid electric device.

15. A thermoelectric cooling module according to claim 1, wherein:

said fin-shaped portion of said heat radiating electrode has a plurality of projections respectively provided in parallel.

16. A thermoelectric cooling module according to claim 1, wherein:

said heat absorbing electrodes are arranged on a whole area of said solid electronic device.

17. A thermoelectric cooling module according to claim 12, wherein said electronic device is one selected from the group consisting of a CPU, MPU, transistor, IC, semiconductor laser, light emitting diode, CCD, or oscillating circuit.

18. A method for manufacturing a thermoelectric cooling module in which a heat absorbing electrode, a P-type thermoelectric semiconductor element, a heat radiating electrode, and an N-type thermoelectric semiconductor element are electrically connected in this order is repeated a plurality of times, and when a current is supplied, said heat absorbing electrode absorbs heat while said heat radiating electrode radiates the absorbed heat due to the Peltier effect, thereby cooling a solid electronic device required to have temperature stability, said thermoelectric cooling device comprising:

a heat radiating section manufacturing step of inserting a heat radiating electrode having a fin-shaped portion into each of a plurality of through holes formed in a radiation-side insulating substrate and fixing said heat radiating electrode to said radiation-side insulating substrate, thereby manufacturing a heat radiation section;

a heat absorbing section manufacturing step of inserting a heat absorbing electrode into each of a plurality of through holes formed in an absorption-side insulating substrate and fixing said heat absorbing electrode to said absorption-side insulating substrate, thereby manufacturing a heat absorbing section; and a joining step of joining one end surface of each P-type semiconductor and one end surface of each N-type semiconductor to said heat radiating section, while joining the other end surface of said P-type semiconductor and the other end surface of said N-type semiconductor to said heat absorbing section.

* * * * *